United States Patent [19]
Akin et al.

[11] Patent Number: 5,860,575
[45] Date of Patent: Jan. 19, 1999

[54] STABILITY ENHANCEMENT OF MOLTEN SOLDER DROPLETS AS EJECTED FROM A NOZZLE OF DROPLET PUMP

[76] Inventors: James Sherill Akin, 1321 Amistad Dr., Round Rock, Tex. 78664; Edward Blakley Menard, 8213 Wexford Dr., Austin, Tex. 78759; Thomas Alan Schiesser, 5704 Shoalwood Ave., Austin, Tex. 78756; Ted Minter Smith, 5905 Linaria Cove, Austin, Tex. 78759

[21] Appl. No.: 723,816

[22] Filed: Sep. 30, 1996

[51] Int. Cl.⁶ .................................................. B22D 35/06
[52] U.S. Cl. .......................................... 222/593; 222/590
[58] Field of Search .................................. 222/590, 591, 222/593

[56] References Cited

U.S. PATENT DOCUMENTS

| | | | |
|---|---|---|---|
| 4,754,900 | 7/1988 | MacKay | 222/590 |
| 4,898,422 | 2/1990 | Muller | 222/590 |
| 4,972,900 | 11/1990 | Szczypiorski | 222/591 |
| 5,042,708 | 8/1991 | Ledermann et al. | 228/55 |
| 5,229,016 | 7/1993 | Hayes et al. | 222/590 |
| 5,377,961 | 1/1995 | Smith et al. | 266/237 |
| 5,415,679 | 5/1995 | Wallace | 222/590 |
| 5,446,261 | 8/1995 | Hernandez et al. | 222/593 |

FOREIGN PATENT DOCUMENTS

| | | |
|---|---|---|
| 56-96532 | 5/1983 | Japan . |
| 1379236 | 2/1975 | United Kingdom . |

*Primary Examiner*—Scott Kastler
*Attorney, Agent, or Firm*—Casimer K. Salys

[57] ABSTRACT

The size and shape of molten solder droplets ejected from a nozzle of a droplet pump are stabilized using flux transported into the aperture region of the nozzle through which the droplets are ejected. The flux is periodically replenished as necessary to remove solder oxides and dross, as well as to lubricate the aperture. The flux may be deposited by spraying onto the nozzle, submersion of the nozzle, contact of the nozzle to a flux film, contact of the nozzle with an intermediate transfer medium, or through injection internal to the nozzle assembly. Fluxes exhibiting high activity and high thermal stability at elevated temperatures are preferred.

16 Claims, 6 Drawing Sheets

STABILITY ENHANCEMENT OF MOLTEN SOLDER DROPLETS AS EJECTED FROM A NOZZLE OF DROPLET PUMP

FIELD OF THE INVENTION

The present invention relates generally to the dispensing of molten metal droplets. More particularly, the invention is directed to improving the size, shape and composition of molten solder droplets ejected by any pump.

BACKGROUND OF THE INVENTION

Digital electronic systems, and in particular personal computers, are undergoing significant reductions in size and increases in functionality with successive design iterations. Associated decreases in the dimensions of integrated circuit components and component input/output terminals have had a direct effect on the patterns of printed circuit board contacts.

Conventional techniques for solder bonding integrated circuit device packages to printed circuit boards are either approaching their technology limits or proving to be expensive to implement with the small dimensions typical of advanced designs. The prevailing technology, stencil printing of solder paste on printed circuit boards, is at its limits while the prevailing alternative technique, forming solder deposits on printed circuit boards by plating, is relatively expensive.

An analogous situation applies to the formation of solder deposit arrays on integrated circuit die, such as with flip-chip devices, or on ceramic integrated circuit packages. The reflow connection of solder balls or solder columns onto integrated circuit die or ceramic packages is likewise a complex and expensive endeavor.

Thus, there has developed a surge of interest in dispensing or jetting molten solder directly onto integrated circuit die (individually or in wafer form), ceramic integrated circuit packages, and printed circuit boards. There are numerous advantages to the use of a solder droplet dispensing or jetting technology when the quality of the molten solder droplets can be controlled in composition, volume, and deposit location. The ability to accurately locate the molten solder droplets as deposited on a substrate has proved to be a manageable task. However, the realization of a molten solder dispensing system which is reliable enough for a manufacturing application, to the extent that the molten solder droplets are consistent in composition, volume, and formation has yet to be realized.

U.S. Pat. No. 5,377,961 describes an electrodynamic pump for dispensing molten solder in droplets of relatively controlled volume. The electrodynamic pump described in this patent is a significant improvement over droplet dispensing machines utilizing electro-strictive transducers, such as piezoelectric devices, and as such defines the basics of a relatively controllable molten solder dispensing system. Though early tests established the viability of the electrodynamic pump for dispensing molten solder droplets, evaluation in a manufacturing setting, where repeatability of droplet dispensing, consistency of droplet composition, and stability of droplet size are crucial, indicated that refinements were needed. In this regard, testing determined that the molten solder located in close proximity to the nozzle aperture did not remain a homogeneous mixture of pure solder with time. Metallurgical analysis of solder ejection nozzle residues and camera analyses of droplet dispensing confirmed that there was a mixture of pure solder and oxidized tin and lead within the droplets, the combination resulting in the creation of droplets with non-uniform physical properties such as surface tension, melting point and affinity for other materials (wettability). Enclosing the nozzle area within a nitrogen gas (oxygen-free) environment did not solve the problems.

Testing of the electrodynamic solder pump determined that the solder droplets were dramatically different after a few hours of operation, notwithstanding the consistency of the input parameters which define the pressure pulses creating the single shot droplets. Further investigation confirmed that the instability was attributable to the nonhomogeneous nature of the solder near the nozzle aperture, the nonhomogeneous solder being composed of the earlier noted mix of pure solder with oxidized tin and lead.

The problem identified during the investigation of droplet uniformity over extended electrodynamic solder pump operation became one of determining what conditions around the nozzle, other than a nitrogen environment, would lead to uniform and stable dispensing of solder droplets over extended periods of time in the context of molten solder having both tin and lead. Solder alloys including other oxidizing metals are inherently so encompassed.

SUMMARY OF THE INVENTION

Molten solder droplet size and composition is stabilized in the context of a dispensing or jetting system through the use of stability enhancing apparatus, comprising a nozzle connected to the dispensing system and having an aperture for passing individual droplets of molten solder, means for depositing flux at the nozzle aperture, and means for causing the flux deposited at the nozzle aperture to wick into the aperture and onto molten solder exposed through the aperture. In a further aspect of the invention, the means for causing the flux deposited at the nozzle aperture to wick comprise a nozzle temperature adequate to activate the flux and a nozzle of aperture size and composition to wick liquid flux. A still further refinement involves the use of a nozzle transport to periodically deposit flux by moving the nozzle into contact with a source of flux.

A particularized practice of the invention involves the use of an electrodynamic pump for dispensing droplets of molten solder responsive to the electrical pulses, and a gantry type transport for positioning the nozzle of the solder pump with reference to the substrate onto which the solder droplets are to be deposited as well as for moving the nozzle to a source of flux. The flux can be applied to the nozzle by immersing the nozzle of the solder dispensing head into a reservoir of flux, contacting the nozzle with a flux transfer media, or extending the nozzle through a thin film of flux drawn from a reservoir. Further refinements include the deposit of flux at the nozzle aperture by transport either internal to the molten solder column or external to the nozzle. The various embodiments provide flux at the nozzle aperture, and by wicking within the nozzle aperture, cause solder material oxides to be chemically broken down, remove oxides from the walls of the aperture, and facilitate the exhaust of trapped gases in the molten solder proximate the nozzle aperture.

These and other features of the invention will be more clearly understood and appreciated upon considering the detailed embodiments described hereinafter.

DETAILED DESCRIPTION OF THE PREFERRED EMBODIMENT

Stabilization of molten solder droplets ejected from a nozzle of a droplet pump is accomplished through the introduction of flux at the nozzle as an aspect of operating the droplet pump. Though flux is widely used in the assembly of printed circuit boards to chemically alter the metallic surfaces for mechanically sound and metallurgically pure solder joints, the present invention involves the use of flux on the soldering dispensing apparatus itself.

The application of flux to the nozzle of the solder droplet pump breaks down solder constituent oxides to provide pure and homogeneous molten solder at the aperture of the solder pump nozzle. Preliminary investigation of the effects of flux on solder droplet dispensing indicates that the flux contributes in three respects. First, the flux breaks down and reduces the tin and lead oxides in the solder column at or near the interface between the molten solder and the nozzle surface to create a homogeneous mixture of pure eutectic solder. Second, the flux breaks down and enhances the removal of oxides on the inner surface of the nozzle aperture itself, smoothing the aperture and essentially lubricating the surface of the aperture with a layer of flux material. Last, the flux reduces the surface tension of the solder at the nozzle aperture itself, thereby refining the wetting of the solder to the nozzle surface around the aperture to eliminate trapped gases in the region. Such trapped gases are believed to degrade uniform droplet dispensing.

The efficacy of flux to improve solder droplet dispensing was first demonstrated through the simple application of flux to the solder droplet pump nozzle using a cotton swab. The heat of the solder droplet pump accelerated the capillary movement of the flux through the aperture, and activated the flux to break down oxides, reduce surface tension, and enhance the movement of droplets through the nozzle aperture. Flux residue did not appear to be a problem. Even if residue build-up does occur, it can be readily removed by simple mechanical scrubbing or cleaning apparatus.

Figure 1:
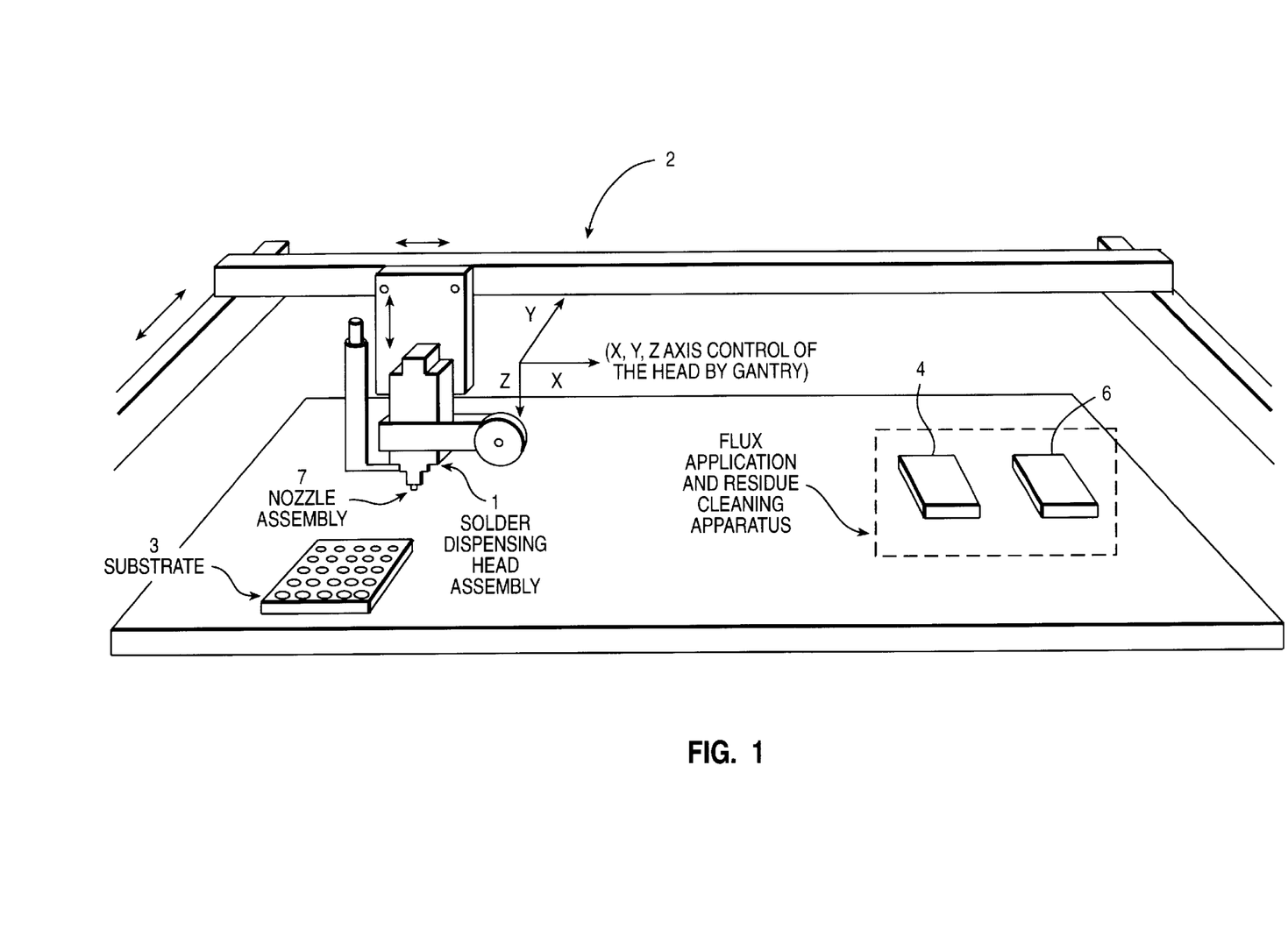
FIG. 1 schematically depicts a manufacturing setting in which a electrodynamic pump is used to deposit molten solder droplets onto a substrate and is operationally stabilized through apparatus for applying flux.

FIG. 1 schematically illustrates an embodiment of the invention within a solder dispensing system. As shown, solder dispensing head 1 is affixed to an XYZ gantry, generally at 2, suitable to position solder dispensing head 1 not only with reference to the substrate 3, onto which solder droplets are deposited, but also with reference to flux application apparatus 4 and residue cleaning apparatus 6. Solder dispensing head 1 initiates the ejection of solder droplets through nozzle 7 in sizes nominally ranging from 4 to 20 mils in diameter onto substrate 3. Substrate 3 may be a printed circuit board with a pattern of copper contacts, a wafer of multiple integrated circuit die (chips) with individual pad patterns, or a fixture holding a multiplicity of individual chips or ceramic packages. In any case, gantry 2 positions nozzle 7 so as to allow the selective deposit of one or more droplets of molten solder onto designated locations of substrate 3.

Experience to date indicates that the solder in dispensing head 1 preferably be an ultra pure 63/37 (tin/lead) composition, and as such represents a class of solder available from a variety of commercial vendors. However, if the solder is being deposited onto wafers or chips, it is more likely to be a high temperature solder of somewhat different proportions, typically 90/10 (lead/tin).

Flux application apparatus 4 is shown by generalized representation, with particular embodiments to be described hereinafter. Apparatus 4 encompasses devices as simple as the aforementioned flux coated cotton swabs. The key feature of the generalized depiction in FIG. 1 is that nozzle 7 is periodically subject to flux application, and possibly flux cleaning, as an aspect of depositing molten solder droplets in patterns onto substrate 3.

Although there are numerous techniques for supplying flux to the nozzle, including broadly submersion, spraying, contact transfer, or injection directly through the molten solder, initial investigation suggests that any consistent periodic application may be adequate to provide the molten solder droplets stability required for present droplet ejection equipment. Given the intricacy and size of the electromagnetic devices associated with the preferred solder droplet ejection head, a periodic external application appears to be a preferred technique over complex designs which injection the flux through a tube in the solder. However, the underlying concept remains the same in that solder flux is used to facilitate consistent solder droplet ejection.

Figure 2:
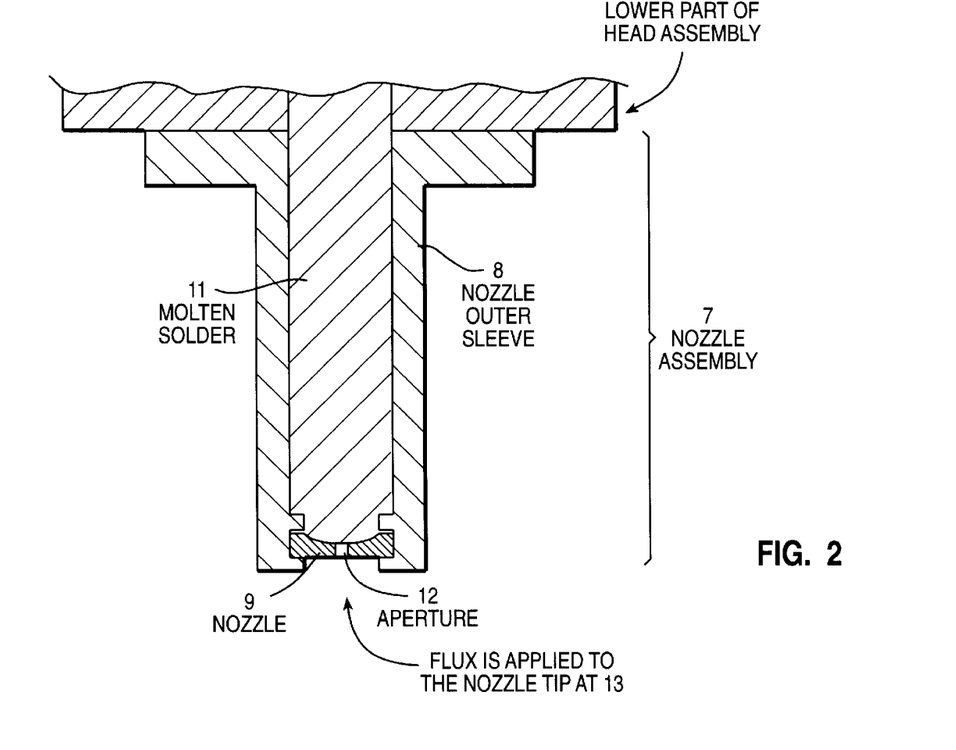
FIG. 2 schematically depicts by cross section the nozzle area of an electrodynamic pumphead.

FIG. 2 schematically depicts nozzle assembly 7 and the related lower part of solder dispensing head assembly 1. As shown, nozzle assembly 7 is connected to the lower part of the head assembly and as such includes an outer sleeve 8 and nozzle 9. A column of molten solder 11 is situated within nozzle outer sleeve 8, and is maintained in a liquid state by heat from the head assembly. Periodic electromagnetically induced pressure pulses from the head assembly, as described in aforementioned U.S. Pat. No. 5,377,961, eject individual droplets through nozzle aperture 12. According to the invention, molten solder droplet stability is enhanced through the application of flux to the tip area, generally 13, of nozzle assembly 7.

Figure 3:
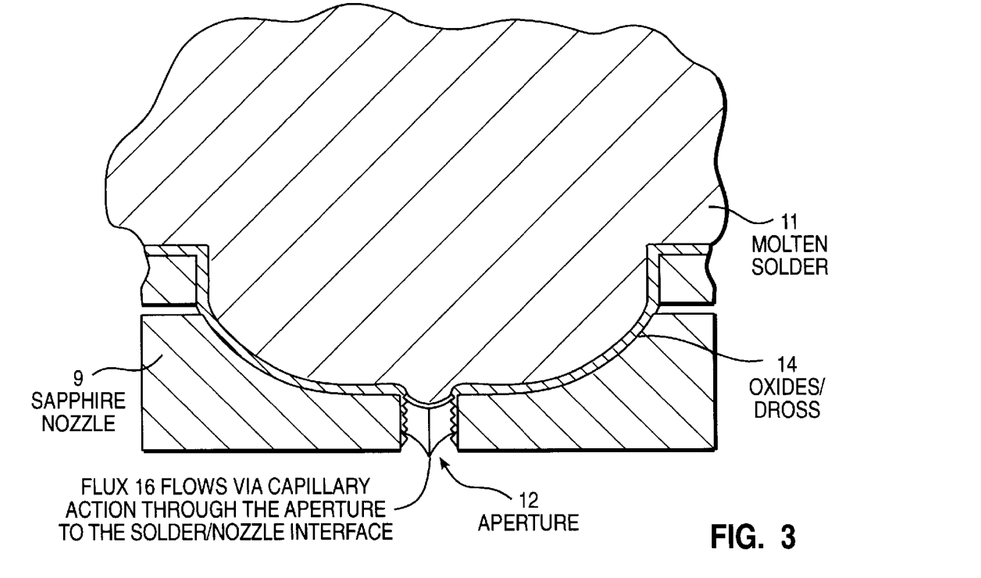
FIG. 3 schematically depicts the nozzle area by cross section including a depiction of the nonhomogeneous solder and wicked flux.

FIG. 3 schematically illustrates in a magnified form nozzle 9, nozzle aperture 12, molten solder 11, and deposited flux 16. As embodied, a sapphire disc is used to form nozzle 9. Molten solder 11 is believed to include oxides/dross regions 14 on the outer surface. Flux applied to the nozzle tip at 13 (FIG. 2) forms a layer of flux 16 by capillary action on the inner walls of aperture 12 as well as the exposed surface of molten solder 11. The activation of the flux is facilitated by the temperature of the nozzle assembly, the activated flux providing the cleaning of oxide/dross 14 from the solder in the region proximate aperture 12. Furthermore, it is believed that flux 16 stabilizes the surface characteristics of molten solder 11 and lubricates the walls of aperture 12.

The composition of the flux is relatively important. In evaluating a variety of fluxes it was found that fluxes geared toward repair of solder work (generally repair fluxes) and hot air solder leveling (HASL) fluxes tended to have the greatest impact on enhancing the stability of the molten solder droplets. Repair fluxes and HASL fluxes tend to have high thermal stability at elevated temperature (greater than 150 degrees C.) and high activity (the ability to break down heavy oxide layers). Since the investigations focused around a relatively narrow temperature window for the nozzle and head, namely in the range of 220–250 degree C., there are likely to be other fluxes suitable for enhancing solder dispensed at temperatures measurably below or measurably above the evaluated range.

For purposes of evaluation, 63/37 (tin/lead) solder dispensed through a nozzle at approximately 230 degrees C. defined the conditions under which the flux must operate without charring and without generating residues that might clog the aperture. Under those operating conditions and through the use of swab flux application, preliminary tests indicated that 10,000–20,000 droplets can be dispensed with relatively good composition and dimensional stability. Two commercially available fluxes which have suitable characteristics for the selected conditions are Kester 450B repair flux and Kester 2438 HASL flux. Both exhibit an activation temperature of 100–130 degrees C. and are stable up to the aforementioned 230 degrees C. of the nozzle.

Figure 4:
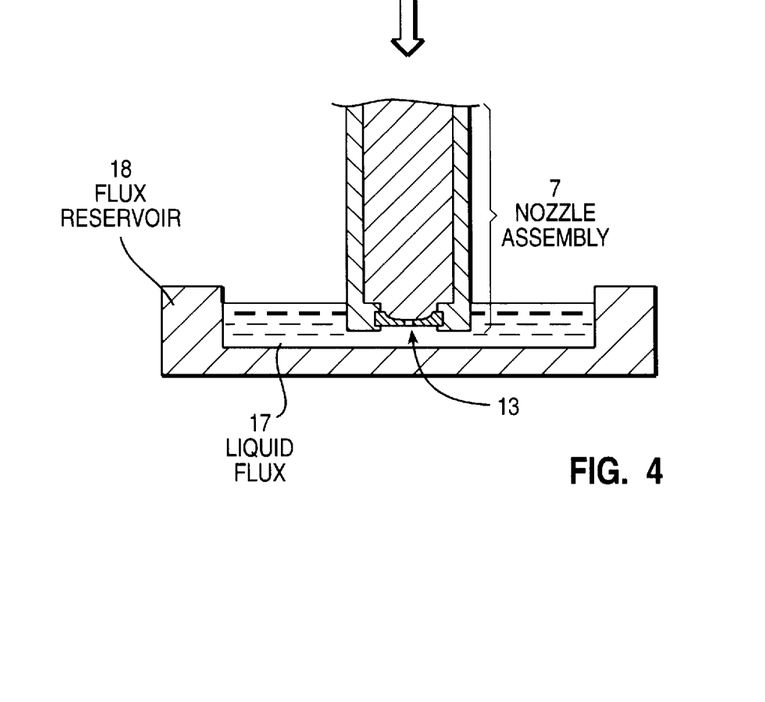
FIG. 4 schematically depicts the insertion of the nozzle into a reservoir of flux.

The present invention contemplates a number of different techniques by which flux is applied to the nozzle tip at 13 (FIG. 2) so as to initiate the capillary action and formation of flux 16 as generally portrayed in FIG. 3. One example appears in FIG. 4, whereby tip 13 of nozzle assembly 7 is inserted into liquid flux 17 within flux reservoir 18. Flux reservoir 18 thereby illustrates one variant of flux application apparatus 4 first depicted in FIG. 1.

Figure 5:
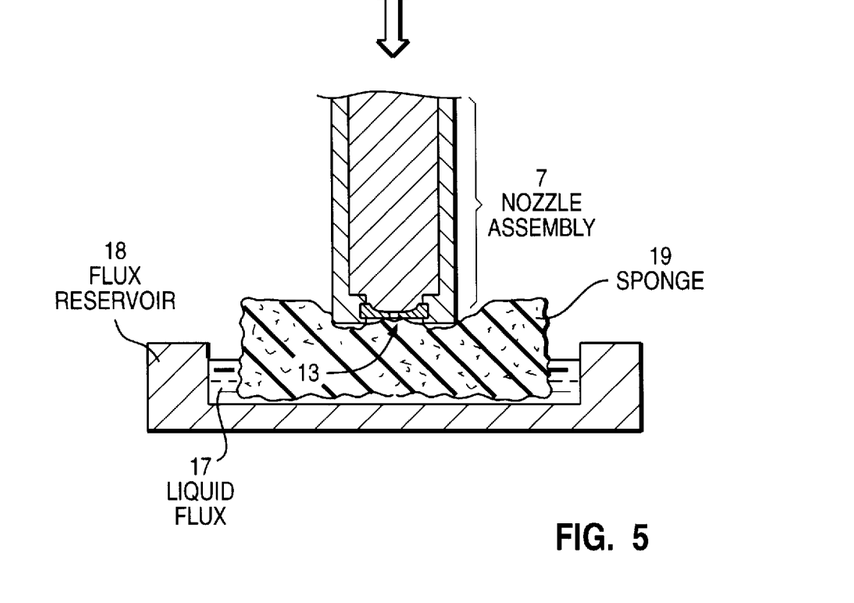
FIG. 5 schematically depicts the transfer of flux onto the nozzle from an intermediate medium.

FIG. 5 illustrates a variation of the flux application apparatus, whereby liquid flux 17 in flux reservoir 18 is transported to nozzle assembly 7 through sponge 19. Transfer of flux by contact with sponge 19, or a functional equivalent medium, limits the volume of flux actually deposited onto the nozzle tip at 13.

Figure 6:
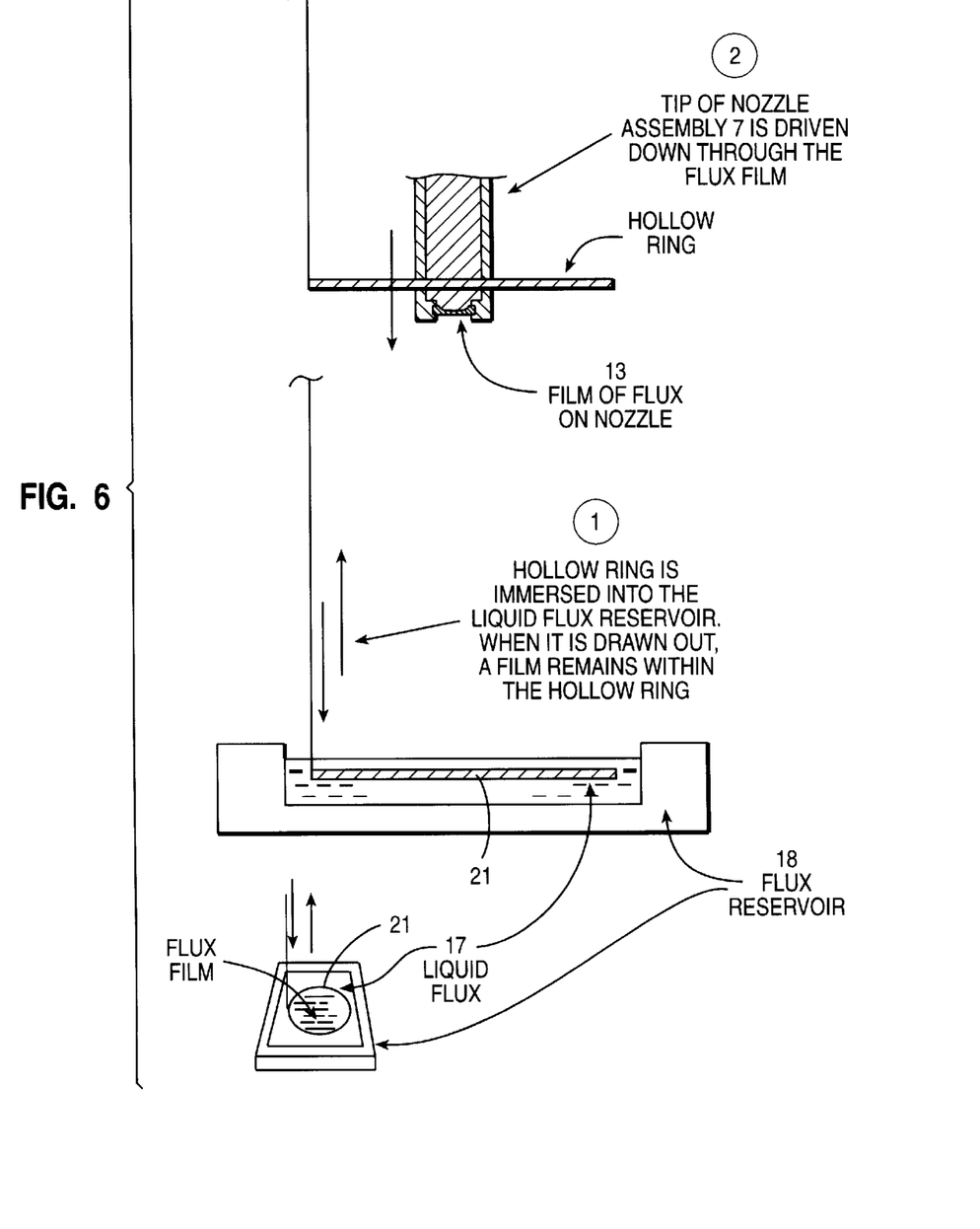
FIG. 6 schematically depicts the transfer of flux onto the nozzle from a thin film.

Another technique for depositing a thin film of flux onto tip 13 of nozzle assembly 7 is illustrated in FIG. 6. As shown at step (1), ring 21 is inserted into liquid flux 17 stored in flux reservoir 18. Upon withdrawal from liquid flux 17, ring 21 retains a thin film of flux across the face of the ring. As shown at step (2), the tip of nozzle assembly 7 is driven through the film of flux to deposit a thin layer onto the nozzle tip at 13.

Figure 7:
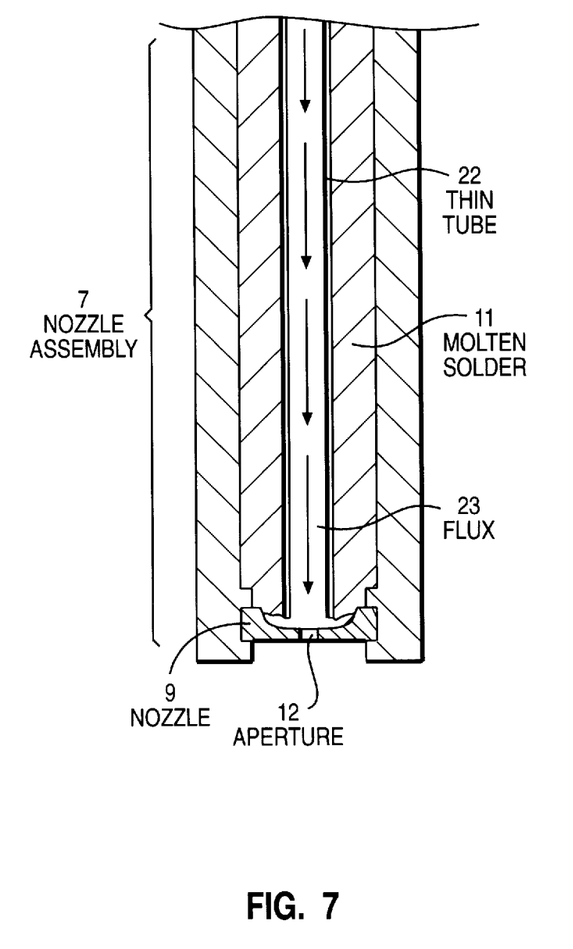
FIG. 7 schematically depicts the transfer of flux to the nozzle through a tube within the molten solder.

Another implementation by which flux can be deposited into aperture 12 of nozzle 9 (FIG. 2) is schematically depicted in FIG. 7. As shown in the figure, thin tube 22 extends down through molten solder 11 in nozzle assembly 7, with the opening of tube 22 lying proximate aperture 12 of nozzle 9. Flux 23 is ejected into the nozzle near aperture 12. Excess flux and flux residue is purged through aperture 12 of nozzle 8 in preparation for molten solder droplet dispensing.

Figure 8:
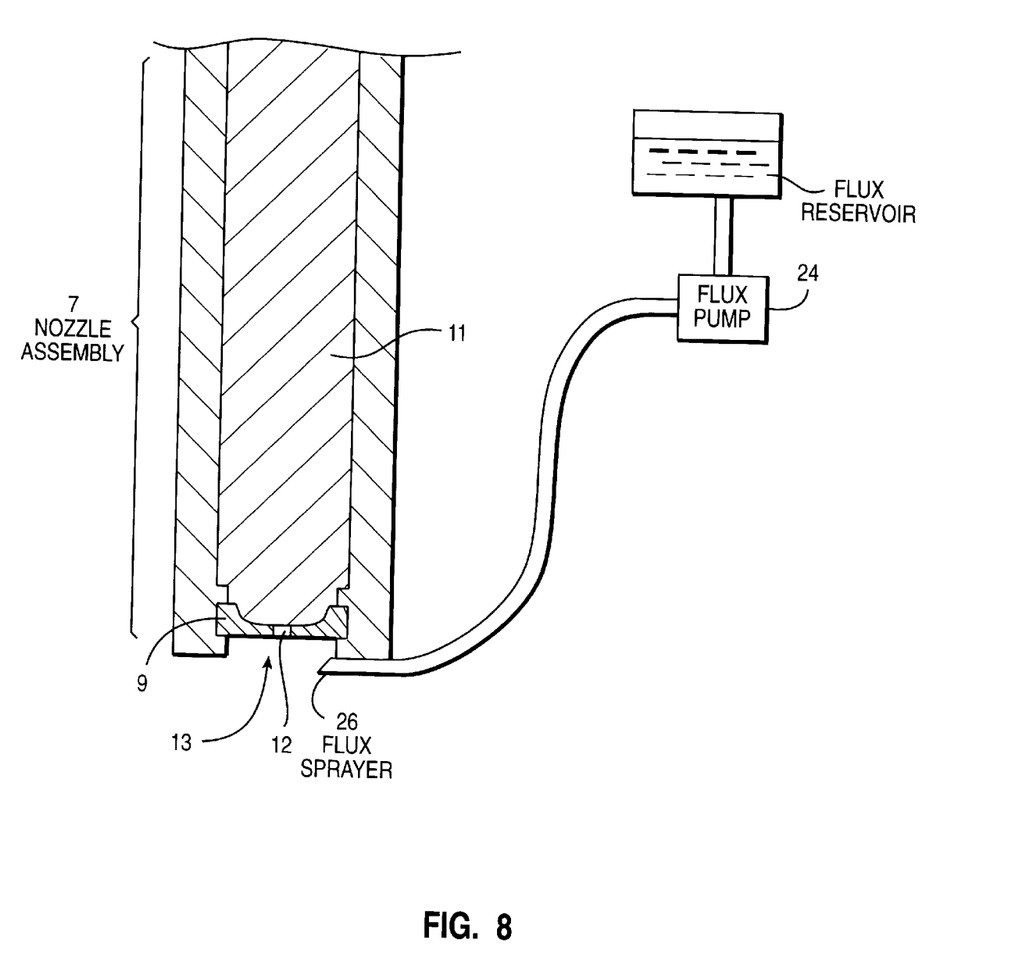
FIG. 8 schematically depicts the transfer of flux to the nozzle through spray tube external to the solder reservoir.

The spraying of flux directly onto the nozzle tip at 13 is schematically depicted in FIG. 8. Again, the underlying objective is to deposit flux in the area of the aperture in an amount adequate to allow capillary draw of the flux through the aperture and to the face of molten solder 11 at aperture 12. In the embodiment of FIG. 8, flux pump 24 in conjunction with flux sprayer 26 dispenses the flux in the amount and at the location desired.

The variety of the embodiments depicted and described illustrates that the key objective of the invention is to provide flux to the molten solder in the region of the nozzle aperture and onto the aperture itself in an amount adequate to clear solder oxides and dross, as well as lubricate the aperture, consistent with the operating temperature of the molten solder. The flux so provided ensures consistent ejection of molten solder droplets from the dispensing head over thousands of cycles, and as such provides a molten solder dispensing machine suitable for a manufacturing environment.

It will be understood by those skilled in the art that the embodiment set forth hereinbefore are merely exemplary of the numerous arrangements by which the invention may be practiced, and as such may be replaced by equivalents without departing from the invention which will now be defined by appended claims.

We claim:

1. A molten solder dispensing system droplet stability enhancing apparatus, comprising:
    a nozzle not wettable by solder connected to the dispensing system and having an aperture for ejecting individual droplets of molten solder;
    means for depositing flux at the nozzle aperture; and
    means for causing the flux deposited at the nozzle aperture to wick into the aperture and onto molten solder exposed through the aperture.

2. The apparatus recited in claim 1, wherein the means for causing the flux deposited at the nozzle aperture to wick comprises a nozzle heat source operable to elevate the temperature at the nozzle to the activation temperature of the flux, and the nozzle aperture of a size and a composition suitable to wick activated flux.

3. The apparatus recited in claim 1, wherein the means for depositing flux is a transport mechanism which periodically causes contact between the nozzle and a source of flux.

4. The apparatus recited in claim 2, wherein the means for depositing flux is a transport mechanism which periodically causes contact between the nozzle and a source of flux.

5. The apparatus recited in claim 1, wherein the means for depositing flux is a tube positioned to eject flux onto the nozzle aperture.

6. The apparatus recited in claim 2, wherein the means for depositing flux is a tube positioned to eject flux onto the nozzle aperture.

7. The apparatus recited in claim 1, wherein the means for depositing flux is a nozzle transport which periodically moves the nozzle through a film of liquid flux drawn from a reservoir.

8. The apparatus recited in claim 2, wherein the means for depositing flux is a nozzle transport which periodically moves the nozzle through a film of liquid flux drawn from a reservoir.

9. In a molten solder dispensing system having a nozzle not wettable by solder connected to elect molten solder droplets through an aperture in the nozzle, a method of stabilizing the characteristics of the droplets dispensed, comprising the steps of:
    depositing flux at the nozzle aperture; and
    causing the flux deposited at the nozzle aperture to wick into the aperture and onto molten solder exposed through the aperture.

10. The method recited in claim 9, wherein the step of causing the flux deposited at the nozzle aperture to wick comprises a heating of the nozzle to a temperature suitable to activate the flux, and using a nozzle of aperture size and composition suitable to wick activated flux.

11. The method recited in claim 9, wherein the step of depositing flux comprises a periodic contact between the nozzle and a source of flux by relative translation.

12. The method recited in claim 10, wherein the step of depositing flux comprises a periodic contact between the nozzle and a source of flux by relative translation.

13. The method recited in claim 9, wherein the step of depositing flux comprises the ejection of flux onto the nozzle aperture through a needle.

14. The method recited in claim 10, wherein the step of depositing flux comprises the ejection of flux onto the nozzle aperture through a needle.

15. The method recited in claim 9, wherein the step of depositing flux comprises the periodic moving of the nozzle by a transport through a film of liquid flux drawn from a reservoir.

16. The method recited in claim 10, wherein the step of depositing flux comprises the periodic moving of the nozzle by a transport through a film of liquid flux drawn from a reservoir.

* * * * *

UNITED STATES PATENT AND TRADEMARK OFFICE
CERTIFICATE OF CORRECTION

PATENT NO. : 5,860,575
DATED : Jan. 19, 1999
INVENTOR(S) : James Sherill Akin et al It is certified that error appears in the above-indentified patent and that said Letters Patent is hereby corrected as shown below:

ON THE TITLE PAGE:

Afer item [76], please insert item --[73] Assignee:
International Business Machines
Corporation, Armonk, New York Signed and Sealed this Second Day of November, 1999

*Attest:*

Q. TODD DICKINSON

*Attesting Officer*       Acting Commissioner of Patents and Trademarks